US012660126B2

(12) United States Patent
Takagi et al.

(10) Patent No.: US 12,660,126 B2
(45) Date of Patent: Jun. 16, 2026

(54) REFRIGERATION CYCLE APPARATUS

(71) Applicant: DAIKIN INDUSTRIES, LTD., Osaka (JP)

(72) Inventors: Motoki Takagi, Osaka (JP); Hidehiko Kataoka, Osaka (JP); Takashi Tamba, Osaka (JP); Hitoshi Okubo, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 99 days.

(21) Appl. No.: 18/743,401

(22) Filed: Jun. 14, 2024

(65) Prior Publication Data

US 2024/0334650 A1      Oct. 3, 2024

Related U.S. Application Data

(63) Continuation of application No. PCT/JP2022/036965, filed on Oct. 3, 2022.

(30) Foreign Application Priority Data

Dec. 15, 2021     (JP) ................................. 2021-203044

(51) Int. Cl.
H05K 7/20          (2006.01)
F25B 1/00          (2006.01)

(52) U.S. Cl.
CPC ........... H05K 7/20318 (2013.01); F25B 1/00 (2013.01); H05K 7/20309 (2013.01); H05K 7/20327 (2013.01)

(58) Field of Classification Search
CPC ........... H05K 7/20318; H05K 7/20309; H05K 7/20327; F25B 1/00; F25B 2400/12;
(Continued)

(56) References Cited

U.S. PATENT DOCUMENTS

2014/0124175 A1    5/2014  Sao et al.
2015/0092370 A1*   4/2015  Astle et al. .......... H05K 3/0079
                                                    361/765
(Continued)

FOREIGN PATENT DOCUMENTS

CN        1721781 A      1/2006
CN        103502738 A    1/2014
(Continued)

OTHER PUBLICATIONS

JP 2021139578 A Translation (Year: 2021).*
(Continued)

*Primary Examiner* — Jerry-Daryl Fletcher
*Assistant Examiner* — Dario Antonio Deleon
(74) *Attorney, Agent, or Firm* — Birch, Stewart, Kolasch & Birch, LLP

(57) ABSTRACT

A refrigerant pipe through which a flammable refrigerant flows is disposed in a machine chamber. An electric component including a substrate on which a heat-generating component is mounted is disposed in a fan chamber. In a working fluid channel, a working fluid is circulated between an evaporator and a condenser. The evaporator causes heat exchange between the heat-generating component and the working fluid. The condenser causes heat exchange between the flammable refrigerant flowing through the refrigerant pipe and the working fluid.

17 Claims, 14 Drawing Sheets

(58) Field of Classification Search
CPC ..... F25B 2500/221; F25B 13/00; F24F 11/89; F24F 1/24
See application file for complete search history.

(56) References Cited

U.S. PATENT DOCUMENTS

| | | | |
|---|---|---|---|
| 2015/0292820 A1* | 10/2015 | Katoh et al. ............ | F25B 39/04 165/140 |
| 2020/0096208 A1* | 3/2020 | Morita et al. .......... | F24F 13/20 |

FOREIGN PATENT DOCUMENTS

| | | | | |
|---|---|---|---|---|
| CN | 109073260 A | | 12/2018 | |
| CN | 110709642 A | | 1/2020 | |
| CN | 110986192 A | | 4/2020 | |
| CN | 111578392 A | | 8/2020 | |
| CN | 213841139 U | * | 7/2021 | ............... F24F 1/24 |
| CN | 113280408 A | | 8/2021 | |
| EP | 3 460 346 A1 | | 3/2019 | |
| JP | 2000-234767 A | | 8/2000 | |
| JP | WO 2013005810 A1 | * | 1/2013 | ............... F24F 1/24 |
| JP | WO 2016143070 A1 | * | 9/2016 | ......... H05K 7/20936 |
| JP | 2016205676 A | * | 12/2016 | ............... F24F 1/48 |
| JP | 2017172930 A | * | 9/2017 | ............... F24F 1/24 |
| JP | 3392573 A1 | * | 10/2018 | ............... F24F 1/48 |
| JP | WO 2019176053 A1 | * | 9/2019 | ............... F25B 1/00 |
| JP | 2021139578 A | * | 9/2021 | ............... F24F 1/24 |
| WO | WO 2019/159360 A1 | | 8/2019 | |

OTHER PUBLICATIONS

CN 213841139 U Translation (Year: 2021).*
WO 2019176053 A1 Translation (Year: 2019).*
EP 3392573 A1 Translation (Year: 2018).*
JP 2017172930 A Translation (Year: 2017).*
JP 2016205676 A Translation (Year: 2016).*
WO 2016143070 A1 Translation (Year: 2016).*
WO 2013005810 A1 Translation (Year: 2013).*
International Preliminary Report on Patentability and Written Opinion of the International Searching Authority for International Application No. PCT/JP2022/036965, dated Jun. 27, 2024.
The International Search Report (PCT/ISA/210) issued in PCT/JP2022/036965, mailed on Dec. 20, 2022.
Extended European Search Report for European Application No. 22906965.3, dated Mar. 4, 2025.

* cited by examiner

REAR

LEFT ←——→ RIGHT

FRONT

UP

LEFT ⟷ RIGHT

DOWN

LEFT ⟵⟶ RIGHT

DOWN

UP

LEFT ⟷ RIGHT

DOWN

REFRIGERATION CYCLE APPARATUS

CROSS REFERENCE TO RELATED APPLICATIONS

This application is a Continuation of PCT International Application No. PCT/JP2022/036965, filed on Oct. 3, 2022, which claims priority under 35 U.S.C. 119(a) to Patent Application No. 2021-203044, filed in Japan on Dec. 15, 2021, all of which are hereby expressly incorporated by reference into the present application.

TECHNICAL FIELD

The present disclosure relates to a refrigeration cycle apparatus.

BACKGROUND ART

Patent Document 1 discloses a cooling system for an electric component, in which an inside of a heat transfer unit is partitioned into an evaporator and a condenser, and the electric component is fixed to a position corresponding to the evaporator, whereas a refrigerant jacket is fixed to a position corresponding to the condenser, so that a working fluid circulate between the evaporator and the condenser.

CITATION LIST

Patent Document

Patent Document 1: Japanese Unexamined Patent Publication No. 2016-205676

SUMMARY

A first aspect of the present disclosure is directed to a refrigeration cycle apparatus including: a body casing (30); a partitioning member (31) partitioning an inside of the body casing (30) into a machine chamber (32) and a fan chamber (33); a compressor (24) disposed in the machine chamber (32); and a fan (22) disposed in the fan chamber (33), wherein a refrigerant pipe (26) which is connected to the compressor (24) and through which a flammable refrigerant flows is disposed in the machine chamber (32), an electric component (40) including a substrate (42) on which a heat-generating component (41) is mounted is disposed in the fan chamber (33), the refrigeration cycle apparatus further includes a cooling unit (60) including a working fluid channel (61) through which a working fluid flows, an evaporator (62) configured to evaporate the working fluid, and a condenser (63) configured to condense the working fluid, in the working fluid channel (61), the working fluid is circulated between the evaporator (62) and the condenser (63), the evaporator (62) causes heat exchange between the heat-generating component (41) and the working fluid, and the condenser (63) causes heat exchange between the flammable refrigerant flowing through the refrigerant pipe (26) and the working fluid.

BRIEF DESCRIPTION OF THE DRAWINGS

FIG. 4 is a perspective view of configurations of a substrate casing and a cooling unit.

DESCRIPTION OF EMBODIMENTS

Figure 1:
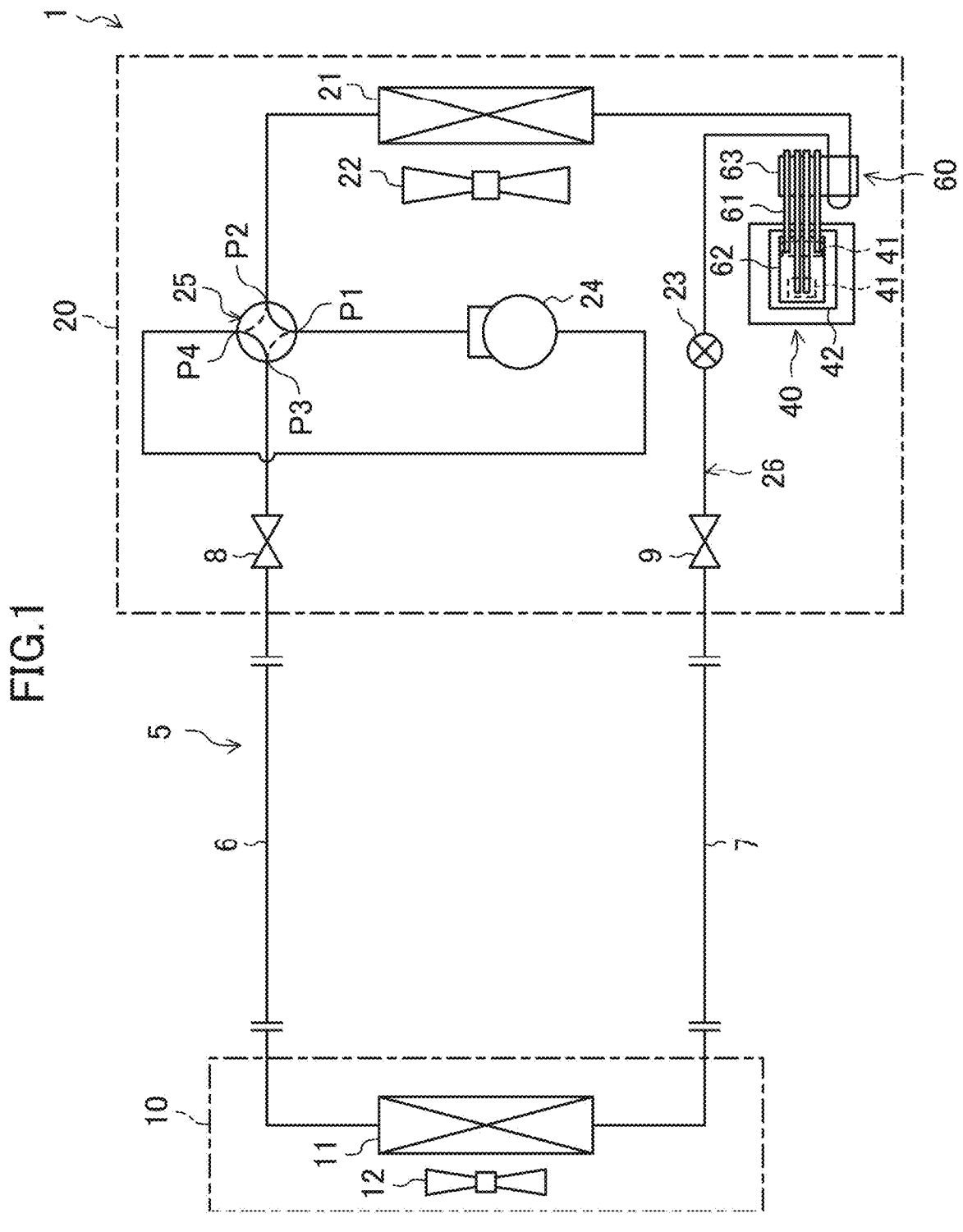
FIG. 1 is a refrigerant circuit diagram of a refrigeration cycle apparatus according to this embodiment.

As illustrated in FIG. 1, a refrigeration cycle apparatus (1) is an air-conditioning device. The refrigeration cycle apparatus (1) includes a refrigerant circuit (5). The refrigerant circuit (5) is filled with a flammable, natural refrigerant. The refrigerant circuit (5) performs a refrigeration cycle by circulating the refrigerant.

In this embodiment, propane (R290), which is a highly flammable natural refrigerant, is used as the refrigerant. The natural refrigerant is a refrigerant having an ozone depletion potential of zero, a low global warming potential, and a low environmental load. Propane ignites at 500° C. or less.

The flammable refrigerant with which the refrigerant circuit (5) is filled may be other than propane. The flammable refrigerant with which the refrigerant circuit (5) is filled may be, for example, ammonia (R717), which is a natural refrigerant. Alternatively, the flammable refrigerant with which the refrigerant circuit (5) is filled may be methane (R50), ethane (R170), butane (R600), or isobutane (R600a), which is a highly flammable natural refrigerant.

The refrigeration cycle apparatus (1) includes an indoor unit (10) and an outdoor unit (20). The indoor unit (10) is placed inside. The outdoor unit (20) is placed outside. The indoor unit (10) and the outdoor unit (20) are connected to each other by a gas pipe (6) and a liquid pipe (7). A gas shut-off valve (8) is connected to the gas pipe (6). A liquid shut-off valve (9) is connected to the liquid pipe (7).

\<Indoor Unit\>

The indoor unit (10) includes an indoor heat exchanger (11) and an indoor fan (12). The indoor heat exchanger (11) is, for example, a cross-fin type fin-and-tube heat exchanger.

In the indoor heat exchanger (11), heat exchange occurs between the refrigerant flowing through the heat transfer tube and air blown by the indoor fan (12).

<Outdoor Unit>

The outdoor unit (20) includes an outdoor heat exchanger (21), an outdoor fan (22) as a fan, an outdoor expansion valve (23), a compressor (24), a four-way switching valve (25), an electric component (40), and a cooling unit (60). The outdoor heat exchanger (21), the outdoor expansion valve (23), the compressor (24), and the four-way switching valve (25) are connected by a refrigerant pipe (26). A flammable refrigerant flows through the refrigerant pipe (26).

The outdoor heat exchanger (21) is, for example, a cross-fin type fin-and-tube heat exchanger. The outdoor heat exchanger (21) includes a plurality of fins (21a) and a heat transfer tube (21b). The plurality of fins (21a) are arranged at intervals in the direction orthogonal to the air flow direction. The heat transfer tube (21b) extends so as to pass through the fins (21a) in the thickness direction and is folded back at both ends of the outdoor heat exchanger (21) to form multiple sections in the up-down direction.

In the outdoor heat exchanger (21), heat exchange occurs between the refrigerant flowing through the heat transfer tube (21b) and air blown by the outdoor fan (22). The outdoor expansion valve (23) is, for example, an electronic expansion valve.

The compressor (24) is, for example, a rotary compressor such as a scroll compressor. The four-way switching valve (25) has a first port (P1), a second port (P2), a third port (P3), and a fourth port (P4).

During the cooling operation, the four-way switching valve (25) is in a state (indicated by the solid lines in FIG. 1) where the first port (P1) and the second port (P2) are in communication with each other, and the third port (P3) and the fourth port (P4) are in communication with each other. During the heating operation, the four-way switching valve (25) is in a state (indicated by the broken lines in FIG. 1) where the first port (P1) and the third port (P3) are in communication with each other and the second port (P2) and the fourth port (P4) are in communication with each other.

Figure 2:
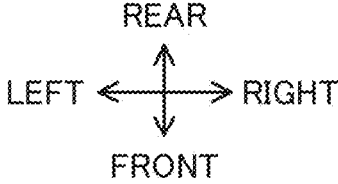
FIG. 2 is a plan sectional view of a configuration of an outdoor unit.
Figure 3:
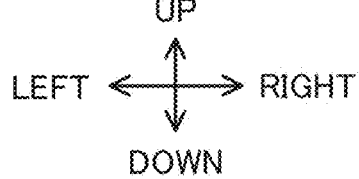
FIG. 3 is a front sectional view of the configuration of the outdoor unit.

As illustrated in FIGS. 2 and 3, the outdoor unit (20) includes a body casing (30). In the drawings, the up and down, front and rear, and left and right directions are indicated by arrows. Unless otherwise specified, directions such as up and down will be described in accordance with the directions indicated by these arrows.

The body casing (30) is formed in a box shape. A partitioning member (31) extending in a front-to-rear direction is disposed to stand in the body casing (30). The partitioning member (31) partitions the body casing (30) into a machine chamber (32) and a fan chamber (33).

The machine chamber (32) is a space in the body casing (30) on the right side of the partitioning member (31). The compressor (24), the four-way switching valve (25), and the refrigerant pipe (26) are arranged in the machine chamber (32).

The fan chamber (33) is a space in the body casing (30) on the left side of the partitioning member (31). The outdoor fan (22), the outdoor heat exchanger (21), and the electric component (40) are arranged in the fan chamber (33).

The fan chamber (33) is provided with the fan support base (34). The fan support base (34) includes a pair of supports (35), a motor bracket (36), and an electric component support base (37). The supports (35) in a pair are disposed in the fan chamber (33) so as to stand at a distance from each other in a right-to-left direction. The motor bracket (36) is attached across the pair of supports (35). A fan motor (22a) of the outdoor fan (22) is attached to the motor bracket (36).

The electric component support base (37) protrudes forward from the pair of supports (35) at a position above the outdoor fan (22). The electric component (40) is placed on, and supported by, the electric component support base (37). The electric component (40) is located at a position away from the partitioning member (31). The supports (35) are shared since the fan support base (34) is provided with the electric component support base (37), and the space can thus be saved.

A suction port (30a) communicating with the fan chamber (33) is formed in each of the rear and left sidewalls of the body casing (30). When the outdoor fan (22) is driven, outside air is sucked into the fan chamber (33) through the suction ports (30a). An outlet port (30b) communicating with the fan chamber (33) is formed in the front sidewall of the body casing (30). When the outdoor fan (22) is driven, the air in the fan chamber (33) is blown out through the outlet port (30b).

Figure 4:
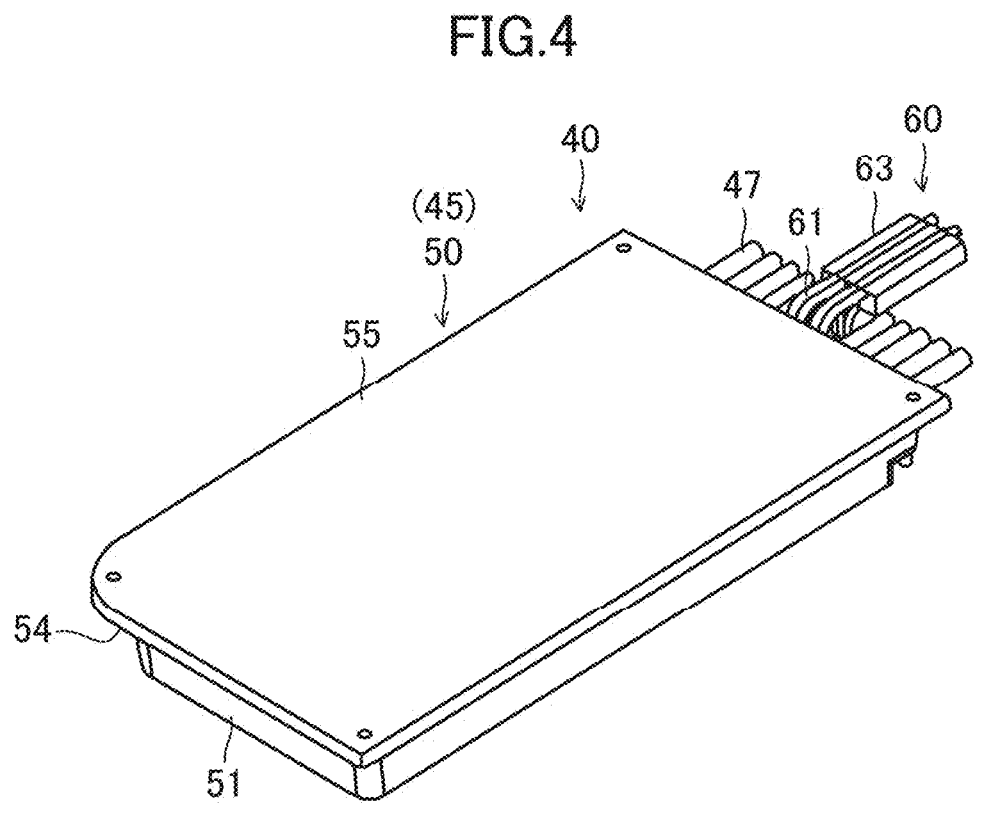
Figure 5:
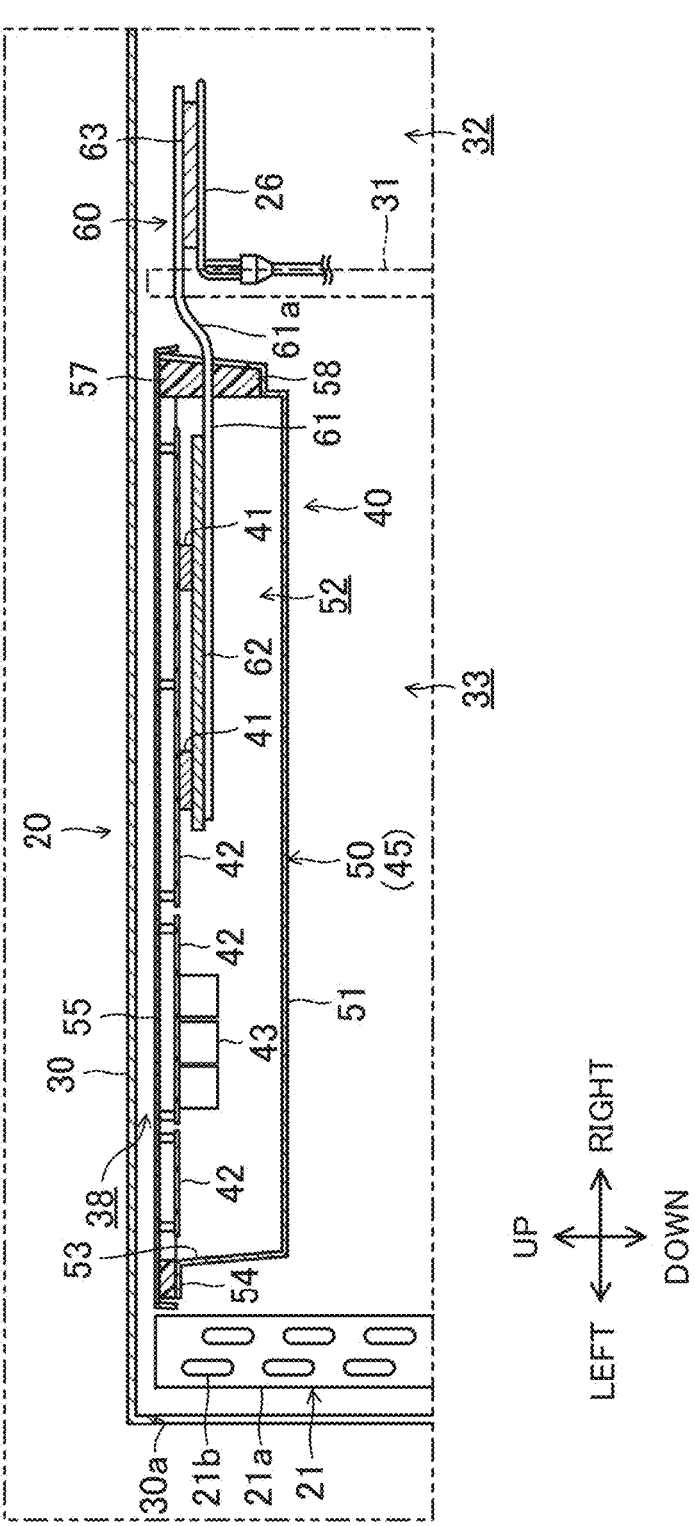
FIG. 5 is a front sectional view of the configurations of the substrate casing and the cooling unit.
Figure 6:
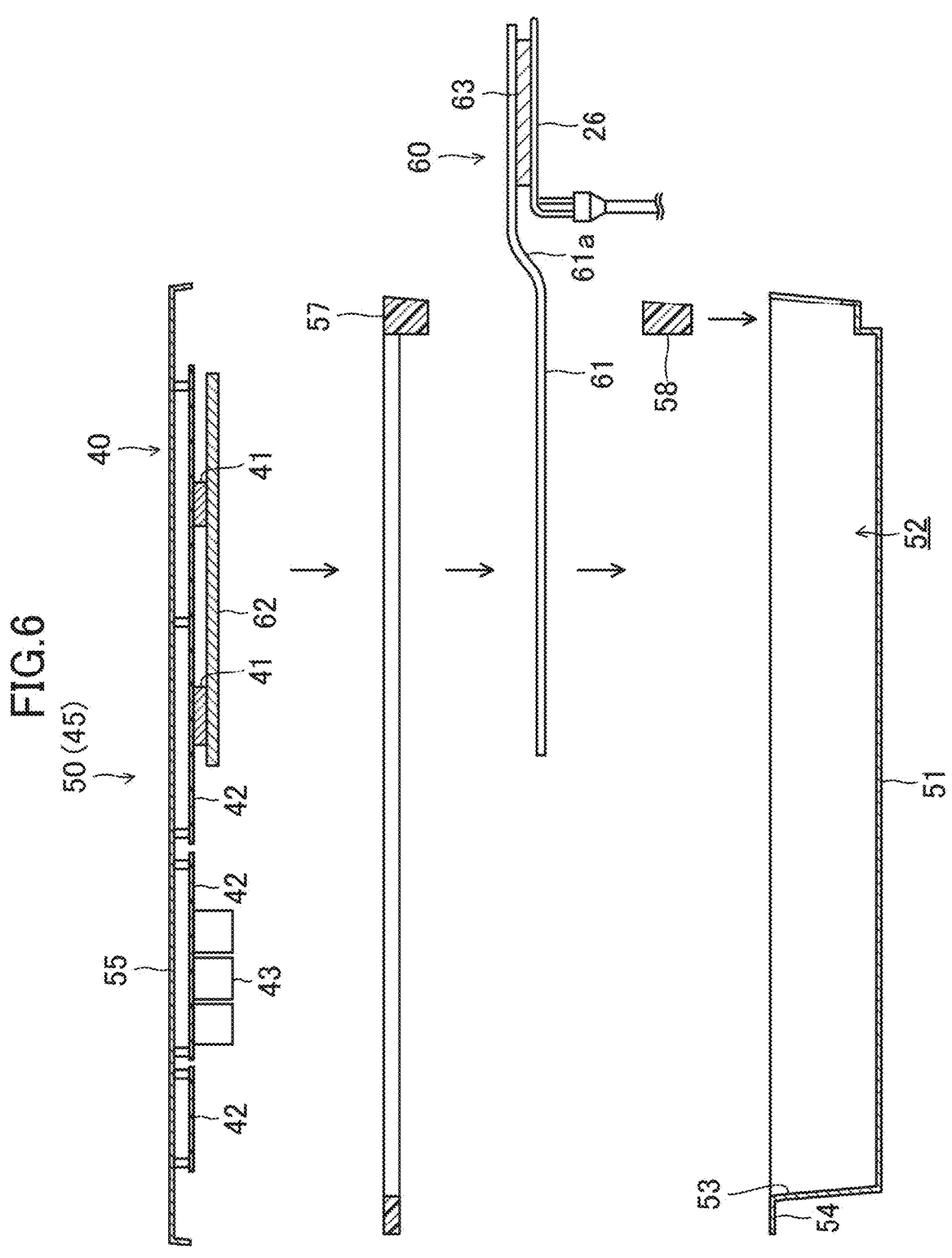
FIG. 6 is a front sectional view of an exploded configuration of the substrate casing.

The electric component (40) constitutes a power converter for supplying power to the motor of the compressor (24). As illustrated in FIGS. 4 to 6, the electric component (40) includes a heat-generating component (41), a substrate (42), and a sealing member (45). The sealing member (45) seals the substrate (42). The sealing member (45) is configured as a substrate casing (50) having a housing space (52) inside.

The heat-generating component (41) is mounted on the substrate (42). The heat-generating component (41) is a switching element (e.g., IGBT or MOSFET) of an inverter circuit (not shown). The heat-generating component (41) is a component which generates a great amount of heat during the operation of the compressor (24). Thus, in order to operate the refrigeration cycle apparatus (1) normally, the heat-generating component (41) needs to be cooled so as not to exceed an operable temperature (e.g., 90° C.). As will be described in detail later, the heat-generating component (41) is cooled by the cooling unit (60). In addition to the heat-generating component (41), an electric component (43) such as a capacitor is mounted on the substrate (42). The substrate (42) is housed in the housing space (52) of the substrate casing (50).

The substrate casing (50) includes a first member (51) and a second member (55). The first member (51) has an opening (53) communicating with the housing space (52). Specifically, the first member (51) is formed in a box shape with an upper opening, and the opening (53) is the upper opening of the first member (51). A portion of the right sidewall of the first member (51) is cut out. A heat pipe (61) to be described later of the cooling unit (60) is drawn out of the substrate casing (50) through the cutout of the first member (51).

The first member (51) includes a flange (54). The flange (54) extends outward along the peripheral portion of the opening (53). The first member (51) includes a first sealing member (57) and a second sealing member (58).

The first sealing member (57) is an integrally-formed portion of a portion extending along the upper surface of the flange (54) and a portion closing the cut-out portion in the right sidewall of the first member (51). The first sealing member (57) is disposed above the heat pipe (61).

The second sealing member (58) is disposed to close the cut-out portion in the right sidewall of the first member (51). The second sealing member (58) is disposed below the heat pipe (61). The heat pipe (61) is sandwiched between the first sealing member (57) and the second sealing member (58). The electric wires (47) (see FIG. 4) drawn out of the substrate (42) are also sandwiched between the first sealing member (57) and the second sealing member (58).

The second member (55) is formed in a box shape with a lower opening, and is disposed to cover the flange (54) of the first member (51) from above. The second member (55) is attached to the first member (51) to close the opening (53). The substrate (42) is attached to the bottom surface side of the second member (55).

The first member (51) and the second member (55) are attached to each other with screws fastening four corners of the flange (54), for example (see FIG. 4). The first sealing member (57) is sandwiched between the flange (54) of the first member (51) and the second member (55) to seal them.

Thus, the substrate (42) is disposed in the housing space (52) of the substrate casing (50) in a sealed state. Here, the state where the substrate (42) is sealed is a state satisfying a water resistance rating of IPX4 or more, more preferably IPX6 or more.

As illustrated in FIG. 5, the substrate (42) is located above the uppermost section of the heat transfer tube (21b) among the multiple sections of the heat transfer tube (21b). Thus, even if the flammable refrigerant leaks from the heat transfer tube (21b), it is possible to keep the leaked refrigerant from flowing toward the substrate (42) because propane as the flammable refrigerant is heavier than air.

In this embodiment, a contact portion between the first member (51) and the second member (55) is located above the uppermost section of the heat transfer tube (21b) among the multiple sections of the heat transfer tube (21b). In other words, a superposed surface between the flange (54) of the first member (51) and the second member (55) (more strictly, the superposed surface between the flange (54) and the first sealing member (57)) is located above the uppermost section of the heat transfer tube (21b).

Thus, even if the flammable refrigerant leaks from the heat transfer tube (21b), it is possible to keep the leaked refrigerant from flowing into the housing space (52) through the superposed surface of the flange (54). The substrate (42) does not need to be located above the uppermost section of the heat transfer tube (21b) if the contact portion between the first member (51) and the second member (55) is located above the uppermost section of the heat transfer tube (21b).

A heat dissipation space (38) for dissipating heat generated in the heat-generating component (41) is provided between a top panel of the body casing (30) and an upper surface of the substrate casing (50). Thus, heat generated in the heat-generating component (41) is dissipated into the heat dissipation space (38), thereby making it possible to reduce heat retention around the electric component (40).

<Cooling Unit>

As illustrated in FIG. 5, the cooling unit (60) includes a plurality of heat pipes (61) as working fluid channels, a heat sink (62) as an evaporator, and a refrigerant jacket (63) as a condenser.

A working fluid is sealed in each of the heat pipes (61). For example, water whose boiling point is lowered by lowering the pressure is used as the working fluid. The working fluid can be, for example, lithium, naphthalene, methanol, and ammonia, but is not limited thereto.

Figure 7:
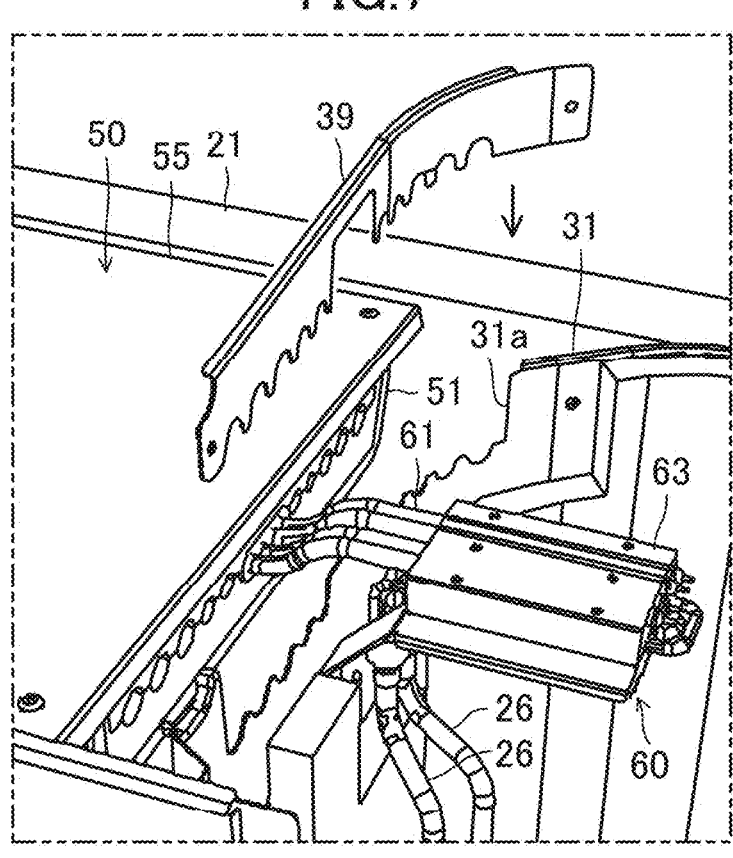
FIG. 7 is a perspective view of a state in which heat pipes pass through a penetration portion of a partitioning member.
Figure 8:
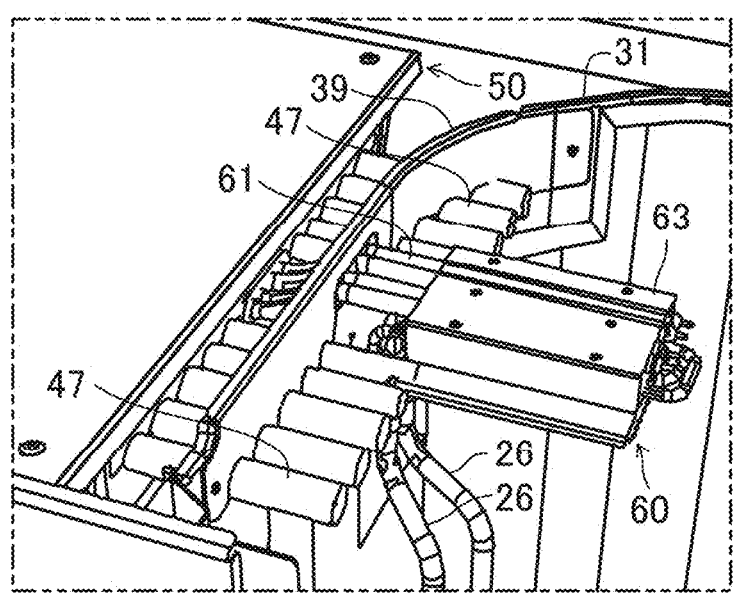
FIG. 8 is a perspective view of a state in which the penetration portion of the partitioning member is closed by a closing member.

As illustrated in FIGS. 7 and 8, the heat pipes (61) pass through the partitioning member (31) and extend in the fan chamber (33) and the machine chamber (32). Specifically, the partitioning member (31) is provided with a penetration portion (31a). The penetration portion (31a) communicates with the machine chamber (32) and the fan chamber (33). The penetration portion (31a) is formed by cutting out a portion of an upper end of the partitioning member (31).

The heat pipes (61) extend through the penetration portion (31a). A total length of each of the heat pipe (61) can thus be shortened. The electric wires (47) also extend through the penetration portion (31a). The penetration portion (31a) is closed by a closing member (39).

The closing member (39) is placed on the partitioning member (31) from above to sandwich the heat pipes (61) and the electric wires (47) passing through the penetration portion (31a). The penetration portion (31a) is closed by the closing member (39). Thus, when the flammable refrigerant leaks from the refrigerant pipe (26) in the machine chamber (32), it is possible to keep the flammable refrigerant from flowing into the fan chamber (33) through the penetration portion (31a) of the partitioning member (31).

In each of the heat pipes (61), the working fluid circulates between a heat sink (62) and the refrigerant jacket (63). As illustrated in FIG. 5, the heat sink (62) is disposed below the refrigerant jacket (63). An inclined portion (61a) is provided in an intermediate portion of the flow path of the heat pipe (61). The inclined portion (61a) extends obliquely upward from the heat sink (62) toward the refrigerant jacket (63). In this configuration, the working fluid which has condensed in the refrigerant jacket (63) flows down along the inclined portion (61a), and thus, the working fluid easily moves toward the heat sink (62).

The inclined portion (61a) of the heat pipe (61) forms an empty space below the refrigerant jacket (63). The refrigerant pipe (26) is disposed in the empty space below the refrigerant jacket (63).

Figure 9:
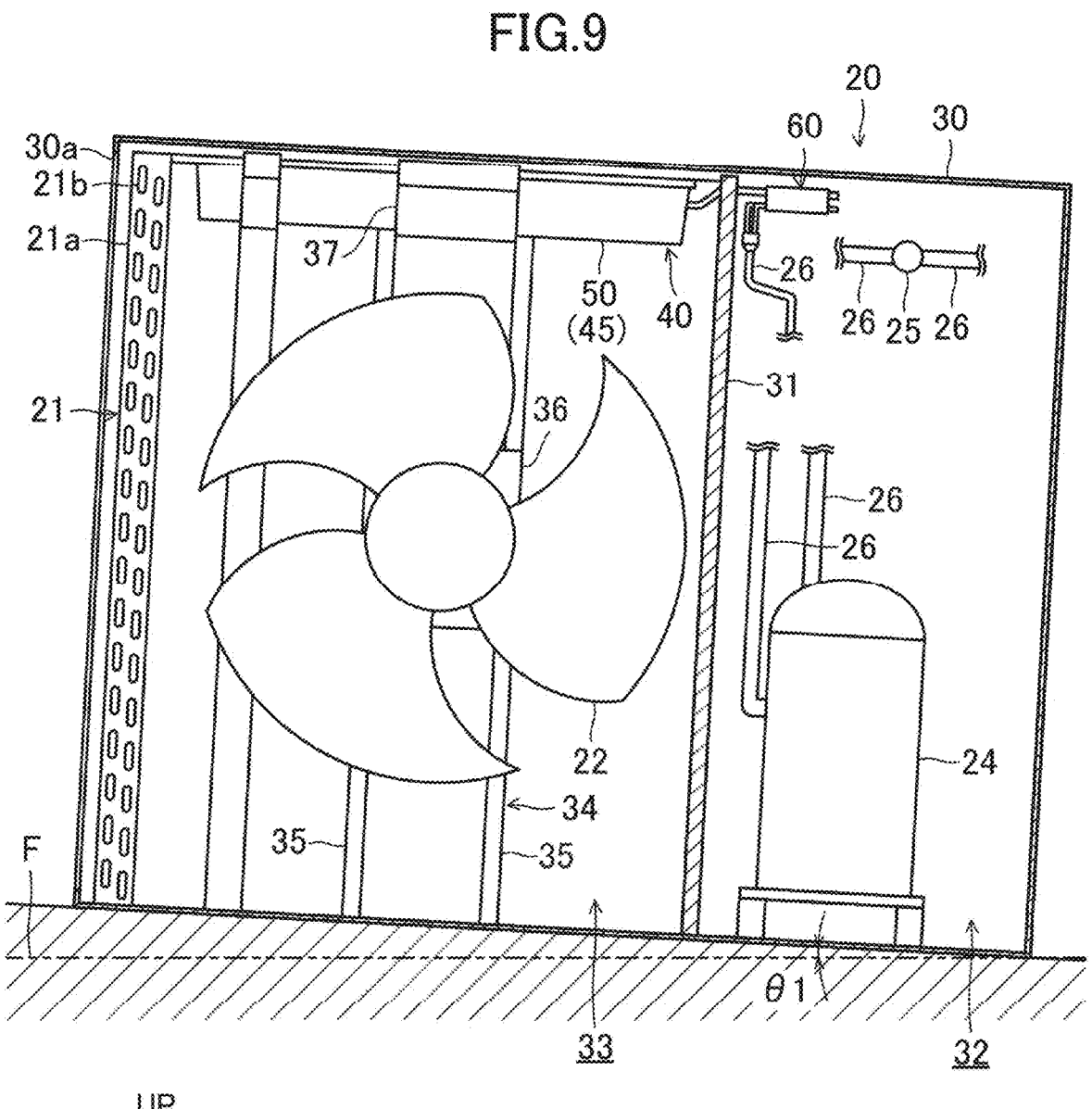
FIG. 9 is a front sectional view of a state in which a body casing is inclined at an allowable inclination angle.

As illustrated in FIG. 9, in installing the body casing (30), an allowable inclination angle θ1 of the body casing (30) is set with respect to an installation reference plane (F) extending in the horizontal direction for stable operation of the refrigeration cycle apparatus (1). The allowable inclination angle θ1 is, for example, 3° or less.

In this embodiment, the positional relationship between the heat sink (62) and the refrigerant jacket (63) has been considered so that the working fluid in the heat pipe (61) can circulate easily even when the body casing (30) is installed in an inclined position at the allowable inclination angle θ1.

Figure 10:
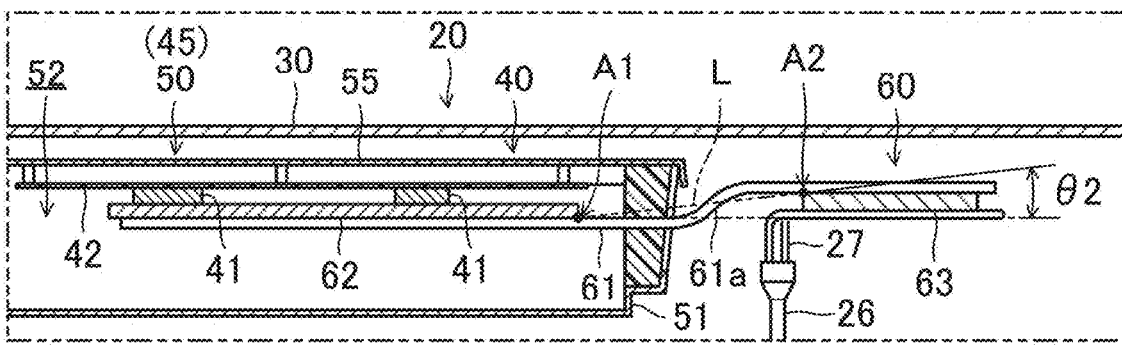
FIG. 10 is a front sectional view of a positional relationship between a heat sink and a refrigerant jacket.
Figure 10:
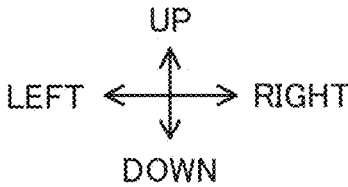

As illustrated in FIG. 10, the point at which an end (the right end in FIG. 10) of the heat sink (62) on the refrigerant jacket (63) side and the heat pipe (61) are in contact with each other is referred to as a point (A1). A point at which an end (the left side in FIG. 10) of the refrigerant jacket (63) on the heat sink (62) side and the heat pipe (61) are in contact with each other is referred to as a point (A2). A straight line connecting the point (A1) of the heat sink (62) and the point (A2) of the refrigerant jacket (63) is referred to as an imaginary straight line (L). The angle formed by the imaginary straight line (L) and the horizontal plane parallel to the installation reference plane (F) is referred to as an inclination angle θ2. At this time, the positions of the heat sink (62) and the refrigerant jacket (63) are set to satisfy θ2>θ1.

Accordingly, even when the body casing (30) is installed in an inclined position, the refrigerant jacket (63) is located at a higher position than the heat sink (62), making it easy for the working fluid which has been condensed in the refrigerant jacket (63) to flow down toward the heat sink (62).

The heat sink (62) is made of a metal material such as aluminum, for example. The heat sink (62) is disposed in the fan chamber (33). Specifically, the heat sink (62) is disposed in tight contact with the heat-generating component (41) inside the substrate casing (50).

Figures 11, 12:
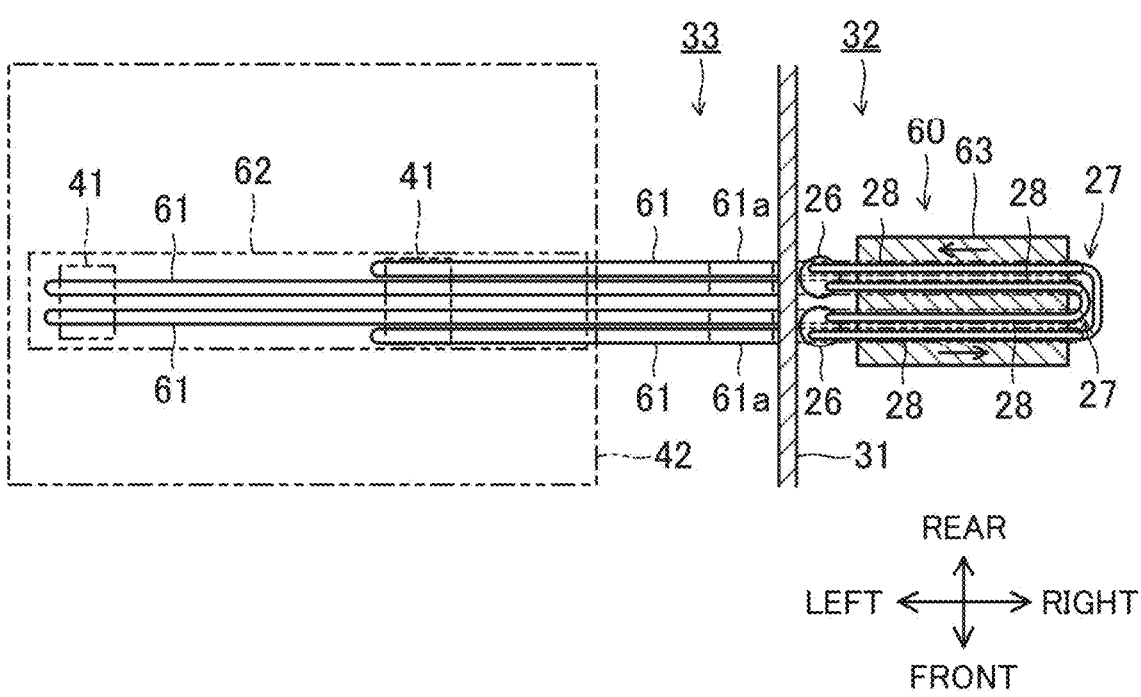
FIG. 11 is a plan sectional view of an arrangement of the heat pipes.
FIG. 12 is a plan sectional view of an arrangement of branch portions of a refrigerant pipe.
Figure 13:
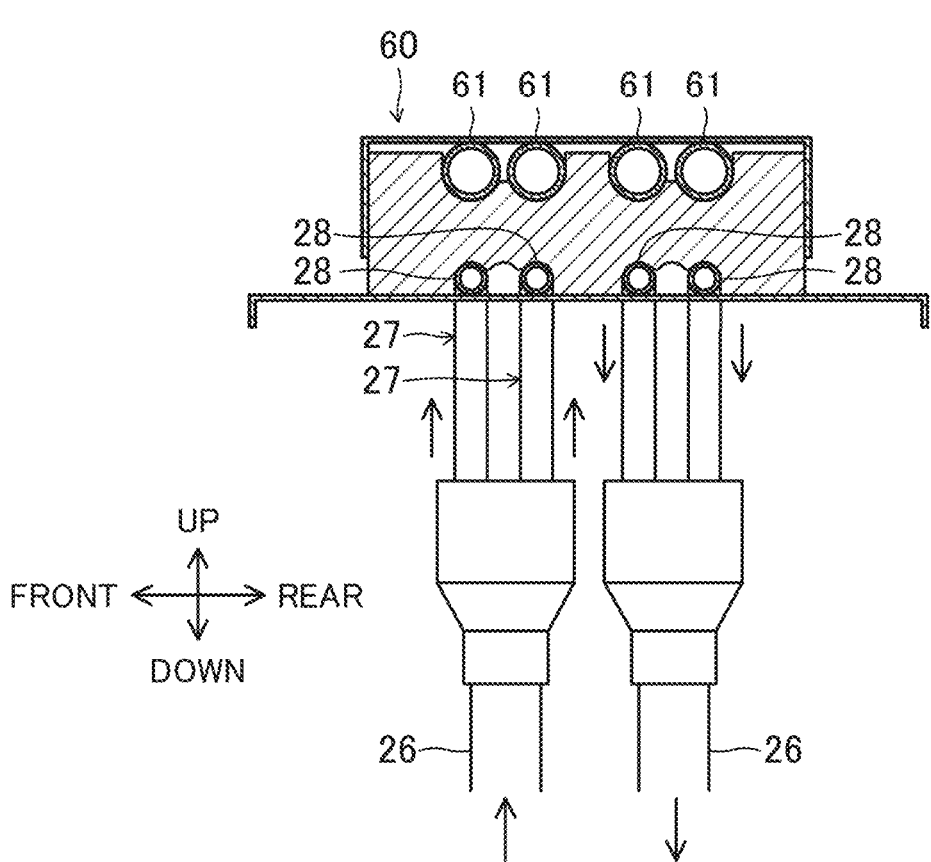
FIG. 13 is a side sectional view of an arrangement of the heat pipes and the refrigerant pipe.

As illustrated in FIG. 11, the heat pipes (61) are disposed in tight contact with the heat sink (62). Four heat pipes (61) are arranged in the front-to-rear direction. In the example illustrated in FIG. 11, two heat-generating components (41)

are arranged at an interval in the right-to-left direction. The second and third heat pipes (61) from the front side in FIG. 11 extend to the position corresponding to the heat-generating component (41) on the left side. The front-most and rear-most heat pipes (61) in FIG. 11 extend to the position corresponding to the heat-generating component (41) on the right side.

Thus, heat exchange occurs between the heat-generating component (41) and the working fluid through the heat sink (62), and the working fluid evaporates. The evaporated working fluid flows toward the refrigerant jacket (63) in the heat pipe (61).

The refrigerant jacket (63) is made of a metal material such as aluminum, for example. The refrigerant jacket (63) is disposed in the machine chamber (32). The plurality of heat pipes (61) are disposed in tight contact with the upper portion of the refrigerant jacket (63). The branch pipes (27) of the refrigerant pipe (26) are disposed in tight contact with the bottom portion of the refrigerant jacket (63). For example, the liquid pipe (7) is used as the refrigerant pipe (26).

As illustrated in FIG. 12, the refrigerant pipe (26) includes a plurality of branch pipes (27). In the example illustrated in FIG. 12, two branch pipes (27) are provided in an intermediate portion of the refrigerant pipe (26). The upstream ends of the branch pipes (27) are connected to the refrigerant pipe (26) on the upstream side. The downstream ends of the branch pipes (27) are connected to the refrigerant pipe (26) on the downstream side. Two branch pipes (27) divide the refrigerant flowing through the refrigerant pipe (26) into two flows, and the two flows are merged again.

Each of the branch pipes (27) extends rightward from the refrigerant pipe (26) on the upstream side along the refrigerant jacket (63) and is then folded leftward to be connected to the refrigerant pipe (26) on the downstream side. Accordingly, four branch portions (28) in tight contact with the refrigerant jacket (63) are formed by the two branch pipes (27). The refrigerant pipe (26) branched into a plurality of pipes allows the flammable refrigerant to flow over a wide area, thereby achieving an increase in the area of heat exchange with the refrigerant jacket (63) and an improvement in cooling efficiency.

The four branch portions (28) are arranged at positions corresponding to the four heat pipes (61) in a one-to-one manner. In the refrigerant jacket (63), heat exchange occurs between the flammable refrigerant flowing through the branch portions (28) of the branch pipes (27) and the working fluid in the heat pipes (61). In other words, heat exchange between the flammable refrigerant and the working fluid can be performed for each of the plurality of heat pipes (61).

The number of heat pipes (61), the number of branch pipes (27), the positions and the number of branch portions (28) are mere examples, and not limited thereto.

Thus, heat exchange occurs between the flammable refrigerant flowing through the refrigerant pipe (26) and the working fluid through the refrigerant jacket (63), and the working fluid condenses. The condensed working fluid flows through the heat pipe (61) toward the heat sink (62).

Thus, in the cooling unit (60), heat exchange occurs between the flammable refrigerant flowing through the refrigerant pipe (26) and the working fluid at a position away from the heat-generating component (41). This makes it possible to cool the heat-generating component (41) while reducing the risk of ignition of the flammable refrigerant.

Advantages of Embodiments

According to the features of this embodiment, a refrigerant pipe (26) through which a flammable refrigerant flows is disposed in a machine chamber (32). An electric component (40) including a substrate (42) on which a heat-generating component (41) is mounted is disposed in a fan chamber (33). In the working fluid channel (61), the working fluid is circulated between the evaporator (62) and the condenser (63), the evaporator (62) causes heat exchange between the heat-generating component (41) and the working fluid, and the condenser (63) causes heat exchange between the flammable refrigerant flowing through the refrigerant pipe (26) and the working fluid.

Thus, heat exchange occurs between the flammable refrigerant flowing through the refrigerant pipe (26) and the working fluid at a position away from the heat-generating component (41), thereby making it possible to cool the heat-generating component (41) while reducing the risk of ignition of the flammable refrigerant.

According to the features of this embodiment, the substrate (42) of the electric component (40) is sealed and isolated from the machine chamber (32) to reduce the risk of ignition from the electric component (40) as an ignition source even when the flammable refrigerant leaks from the refrigerant pipe (26).

According to the features of this embodiment, the substrate (42) is housed in the substrate casing (50), so that the substrate (42) can be in the sealed state.

According to the features of this embodiment, a contact portion between the first member (51) and the second member (55) is located above the uppermost section of the heat transfer tube (21b) among the multiple sections of the heat transfer tube (21b). Thus, even if the flammable refrigerant leaks from the heat transfer tube (21b), it is possible to keep the leaked refrigerant from flowing into the housing space (52) through the attachment contact portion between the first member (51) and the second member (55).

According to the features of this embodiment, the substrate (42) is located above the uppermost section of the heat transfer tube (21b) among the multiple sections of the heat transfer tube (21b). Thus, even if the flammable refrigerant leaks from the heat transfer tube (21b), it is possible to keep the leaked refrigerant from flowing toward the substrate (42).

According to the features of this embodiment, the working fluid can be condensed by the flammable liquid refrigerant flowing through the liquid pipe (7).

According to the features of this embodiment, it is possible to reduce the risk of ignition from the electric component (40) as an ignition source even when R290 is used as the flammable refrigerant.

According to the features of this embodiment, the working fluid channels (61) pass through the partitioning member (31), and thus, the total length of each of the working fluid channels (61) can be shortened to increase the circulation efficiency of the working fluid.

According to the features of this embodiment, the penetration portion (31a) of the partitioning member (31) is closed by the closing member (39) in the state in which the working fluid channels (61) pass through the penetration portion (31a). Thus, when the flammable refrigerant leaks from the refrigerant pipe (26) in the machine chamber (32), it is possible to keep the flammable refrigerant from flowing into the fan chamber (33) through the penetration portion (31a) of the partitioning member (31).

According to the features of this embodiment, an inclined portion (61a) extending upward from the evaporator (62) toward the condenser (63) is provided in an intermediate portion of the working fluid channel (61). Thus, the working fluid which has condensed in the condenser (63) flows down along the inclined portion (61*a*), and thus, the working fluid easily moves toward the evaporator (62).

According to the features of this embodiment, an inclination angle θ2 formed by an installation reference plane (F) extending in a horizontal direction and an imaginary straight line (L) connecting the evaporator (62) and the condenser (63) is larger than an allowable inclination angle θ1 of the body casing (30) with respect to the installation reference plane (F). Accordingly, even when the body casing (30) is installed in an inclined position, the condenser (63) is located at a higher position than the evaporator (62), making it easy for the working fluid which has been condensed in the condenser (63) to flow down toward evaporator (62).

According to the features of this embodiment, the refrigerant pipe (26) is disposed in an empty space formed below the condenser (63) due to the formation of the inclined portion (61*a*) of the working fluid channel (61), and the space can thus be saved.

According to the features of this embodiment, the refrigerant pipe (26) has a plurality of branch portions (28). The refrigerant pipe (26) branched into a plurality of pipes allows the flammable refrigerant to flow over a wide area, thereby achieving an increase in the area of heat exchange with the condenser (63) and an improvement in cooling efficiency.

According to the features of this embodiment, the plurality of branch portions (28) is provided so as to correspond to the plurality of working fluid channels (61) in a one-to-one manner, and thus, heat exchange between the flammable refrigerant and the working fluid can be performed for each of the plurality of working fluid channels (61).

<<First Variation>>

In the following description, the same reference characters denote the same components as those of the foregoing embodiment, and the description is focused only on the difference.

Figure 14:
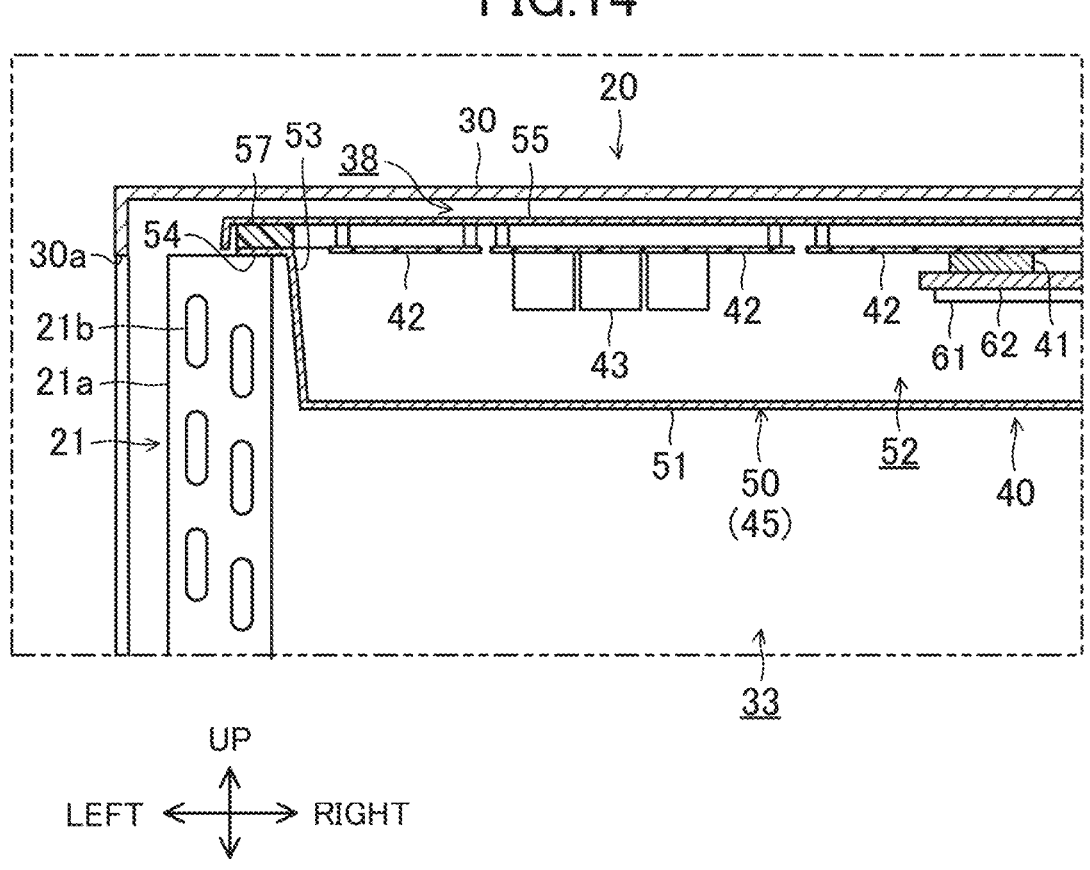
FIG. 14 is a front sectional view of a configuration of an outdoor unit of a first variation.

As illustrated in FIG. 14, the substrate casing (50) includes a first member (51) and a second member (55). The first member (51) includes a flange (54). The flange (54) extends outward along the peripheral portion of the opening (53). The second member (55) is attached to the flange (54) of the first member (51) to close the opening (53). The substrate (42) is housed in the housing space (52) of the substrate casing (50).

The flange (54) of the substrate casing (50) is placed on the fins (21*a*) of the outdoor heat exchanger (21). Therefore, a superposed surface between the flange (54) of the first member (51) and the second member (55) (more strictly, the superposed surface between the flange (54) and the first sealing member (57)) is located above the uppermost section of the heat transfer tube (21*b*) of the outdoor heat exchanger (21).

Thus, even if the flammable refrigerant leaks from the heat transfer tube (21*b*), it is possible to keep the leaked refrigerant from flowing into the housing space (52) through the superposed surface of the flange (54). Further, placing the flange (54) on the fins (21*a*) facilitates the alignment of the height of the substrate casing (50).

<<Second Variation>>

Figure 15:
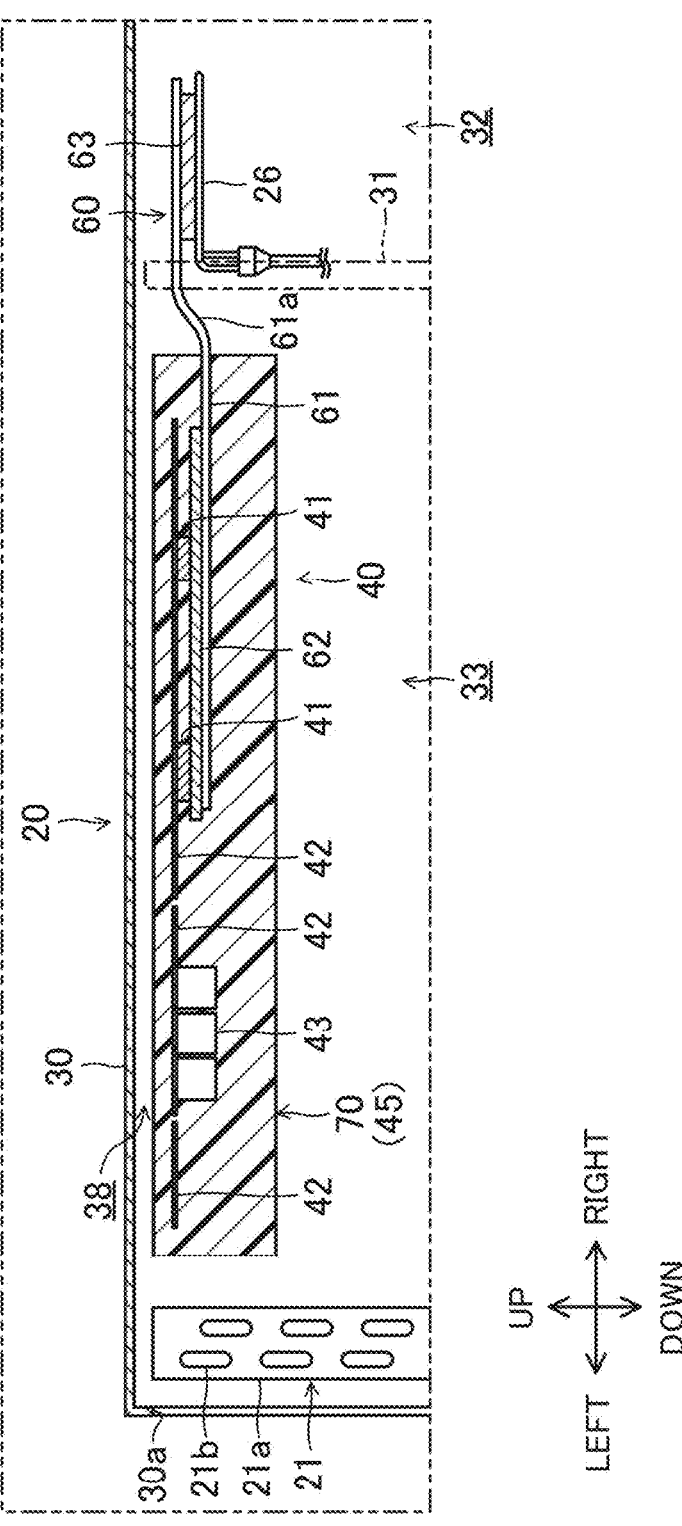
FIG. 15 is a front sectional view of a configuration of an outdoor unit of a second variation.

As illustrated in FIG. 15, the electric component (40) includes a heat-generating component (41), a substrate (42), and a sealing member (45). The sealing member (45) seals the substrate (42). The sealing member (45) is a coating material (70) covering the entire surface of the substrate (42). The coating material (70) is made of, for example, a resin material. In the example illustrated in FIG. 15, a portion of the heat pipe (61) and the heat sink (62) are covered with the coating material (70) in the same manner.

In this way, the coating material (70) covers the entire surface of the substrate (42) to keep the substrate (42) sealed. Accordingly, the risk of ignition from the electric component (40) as an ignition source can be reduced even if the flammable refrigerant leaks from the refrigerant pipe (26).

Since the coating material (70) covers the heat-generating component (41), the substrate (42), the electric component (43), a portion of the heat pipe (61), and the heat sink (62), thermal conduction of not only the heat-generating component (41) in tight contact with the heat sink (62) but also of the electric component (43) is accelerated via the coating material (70). A cooling effect can thus be obtained.

In the example illustrated in FIG. 8, the entire surface of the substrate (42) including the heat-generating component (41), a portion of the heat pipe (61), and the heat sink (62) are covered with the coating material (70), but the configuration is not limited thereto. Specifically, in order to reduce the risk of ignition from the electric component (40) as an ignition source, the entire surface of the substrate (42) including at least the heat-generating component (41) may be covered with the coating material (70).

Other Embodiments

The above-described embodiments may be modified as follows.

In the embodiments described above, the refrigeration cycle apparatus (1) is described as an air-conditioning device including a single refrigerant circuit. However, the refrigeration cycle apparatus (1) is not limited to this configuration.

Figure 16:
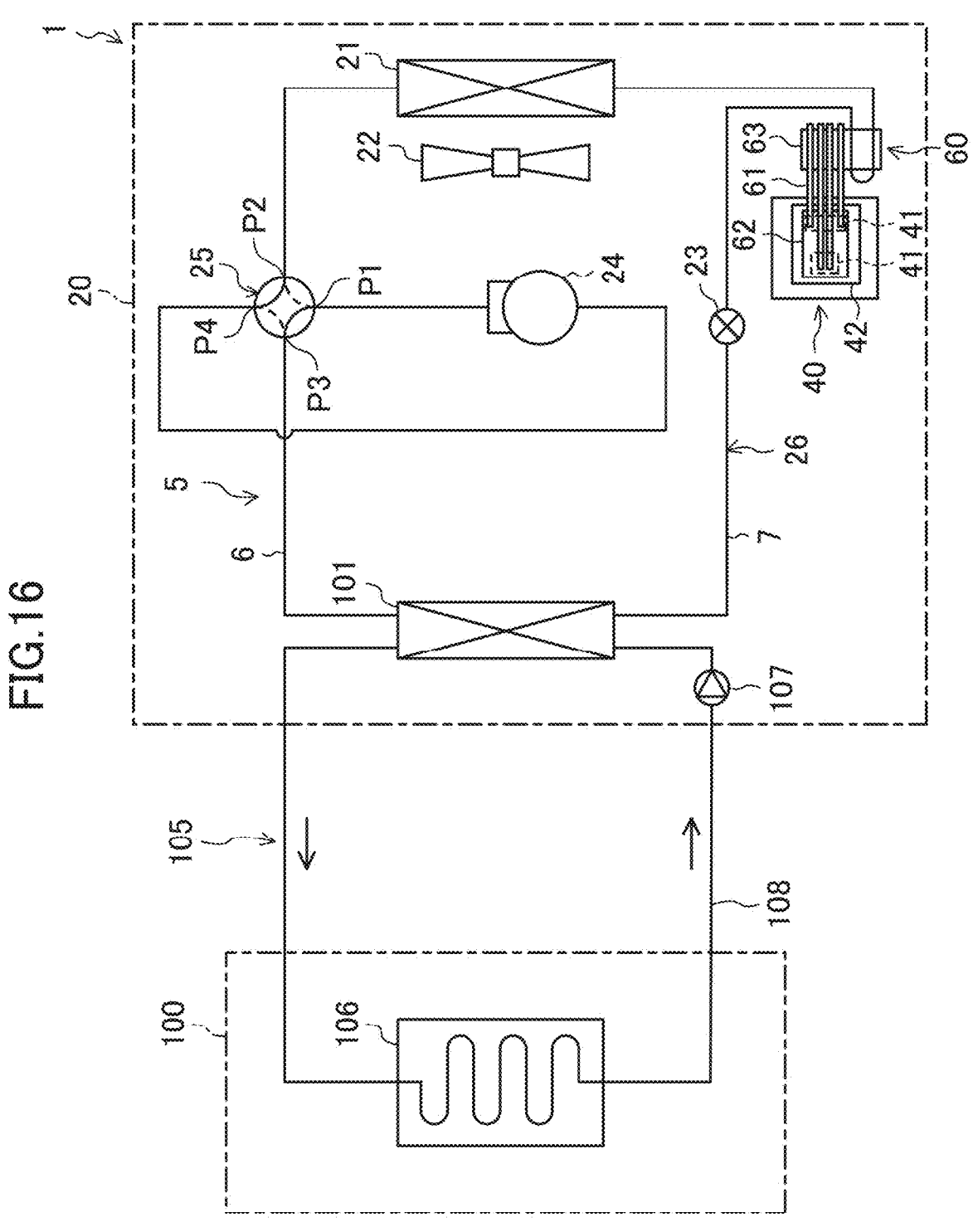
FIG. 16 is a refrigerant circuit diagram of a refrigeration cycle apparatus according to another embodiment.

Specifically, as illustrated in FIG. 16, the refrigeration cycle apparatus (1) includes an air conditioner unit (100) and an outdoor unit (20). The outdoor unit (20) includes a refrigerant circuit (5). The refrigerant circuit (5) is filled with a flammable, natural refrigerant. The refrigerant circuit (5) performs a refrigeration cycle by circulating the refrigerant. The air conditioner unit (100) includes an air conditioner (106) connected to a fluid circuit (105). A temperature adjustment fluid flows through the fluid circuit (105). The temperature adjustment fluid is, for example, water. The air conditioner (106) is installed in an indoor space to be air-conditioned.

Although the number of air conditioners (106) is one in FIG. 16, the number is not limited to one, and a plurality of air conditioners (106) may be provided. When a plurality of air conditioners (106) are provided, the air conditioner unit (100) may be provided with a valve or the like for individually switching between supply and non-supply of the temperature adjustment fluid to the air conditioners (106).

The fluid circuit (105) is configured by connecting a water heat exchanger (101), a fluid pump (107), and the air conditioner (106) by a fluid pipe (108). The fluid pump (107) circulates water in the fluid circuit (105).

The water heat exchanger (101) is connected to the refrigerant pipe (26) of the refrigerant circuit (5). The water heat exchanger (101) causes heat exchange between the flammable refrigerant flowing through the refrigerant pipe (26) and water flowing through the fluid pipe (108).

The four-way switching valve (25) is in a state (indicated by the solid line in FIG. 16) where the first port (P1) and the third port (P3) are in communication with each other, and the second port (P2) and the fourth port (P4) are in communication with each other.

The air conditioner (106) is a heat exchanger that functions as a radiator of the temperature adjustment fluid circulating in the fluid circuit (105). The air conditioner (106) is an example of a target for temperature adjustment. The air conditioner (106) is specifically a radiator, a floor cooling/heating panel, or the like. For example, in a case in which the air conditioner (106) is a radiator, the air conditioner (106) is provided near a wall or the like in the room. For example, in a case in which the air conditioner (106) is a floor cooling/heating panel, the air conditioner (106) is provided under the floor or the like of the room.

While the embodiments and variations have been described above, it will be understood that various changes in form and details can be made without departing from the spirit and scope of the claims. The elements according to embodiments, the variations thereof, and the other embodiments may be combined and replaced with each other. In addition, the expressions of "first," "second," "third," . . . , in the specification and claims are used to distinguish the terms to which these expressions are given, and do not limit the number and order of the terms.

INDUSTRIAL APPLICABILITY

As can be seen in the foregoing, the present disclosure is useful for a refrigeration cycle apparatus.

EXPLANATION OF REFERENCES

1 Refrigeration Cycle Apparatus
5 Refrigerant Circuit
7 Liquid Pipe
21 Outdoor Heat Exchanger (Heat Exchanger)
21a Fin
21b Heat Transfer Tube
22 Outdoor Fan (Fan)
23 Outdoor Expansion Valve
24 Compressor
26 Refrigerant Pipe
27 Branch Pipe
28 Branch Portion
30 Body Casing
31 Partitioning Member
31a Penetration Portion
32 Machine Chamber
33 Fan Chamber
39 Closing Member
40 Electric Component
41 Heat-Generating Component
42 Substrate
45 Sealing Member
50 Substrate Casing
51 First Member
52 Housing Space
53 Opening
54 Flange
55 Second Member
60 Cooling Unit
61 Heat Pipe (Working Fluid Channel)
61a Inclined Portion
62 Heat Sink (Evaporator)
63 Refrigerant Jacket (Condenser)
70 Coating Material
F Installation Reference Plane
L Imaginary Straight Line

The invention claimed is:

1. A refrigeration cycle apparatus comprising:
a body casing; a partition partitioning an inside of the body casing into a machine chamber and a fan chamber; a compressor disposed in the machine chamber; and a fan disposed in the fan chamber, wherein
a refrigerant pipe which is connected to the compressor and through which a flammable refrigerant flows is disposed in the machine chamber,
an electric component including a substrate on which a heat-generating component is mounted is disposed in the fan chamber,
the refrigeration cycle apparatus further comprises a cooling unit including a working fluid channel through which a working fluid flows, an evaporator configured to evaporate the working fluid, and a condenser configured to condense the working fluid,
in the working fluid channel, the working fluid is circulated between the evaporator and the condenser,
the evaporator causes heat exchange between the heat-generating component and the working fluid, and
the condenser causes heat exchange between the flammable refrigerant flowing through the refrigerant pipe and the working fluid.

2. The refrigeration cycle apparatus of claim 1, wherein the substrate is sealed by a sealing member.

3. The refrigeration cycle apparatus of claim 2, wherein the sealing member is a substrate casing having a housing space for housing the substrate.

4. The refrigeration cycle apparatus of claim 3, wherein a heat exchanger having a heat transfer tube is disposed in the fan chamber, the heat transfer tube is disposed in an up-down direction, and
the substrate casing includes: a first member having an opening communicating with the housing space; and a second member in contact with the first member to close the opening and seal the housing space from an outside of the substrate casing, and
a contact portion between the first member and the second member is located above an uppermost section of the heat transfer tube.

5. The refrigeration cycle apparatus of claim 4, wherein the first member is provided with a flange extending outward along a peripheral portion of the opening,
the second member is attached to the flange, and
the flange is placed above the heat exchanger in the up-down direction.

6. The refrigeration cycle apparatus of claim 2, wherein the sealing member is a coating material covering an entire surface of the substrate.

7. The refrigeration cycle apparatus of claim 1, wherein a heat exchanger having a heat transfer tube is disposed in the fan chamber, the heat transfer tube is disposed in an up-down direction, and
the substrate is disposed above an uppermost section of the heat transfer tube.

8. The refrigeration cycle apparatus of claim 1, further comprising:
a refrigerant circuit having a liquid pipe through which the flammable refrigerant flows, wherein
the condenser causes heat exchange between the flammable refrigerant flowing through the liquid pipe and the working fluid.

9. The refrigeration cycle apparatus of claim 1, wherein the flammable refrigerant is R290.

10. The refrigeration cycle apparatus of claim 1, wherein the working fluid channel extends so as to pass through the partition.

11. The refrigeration cycle apparatus of claim 10, wherein the partition is provided with an opening through which the working fluid channel passes, and the refrigeration cycle apparatus further comprises a plate provided at an upper section of the partition closing the opening in a state in which the working fluid channel passes through the opening.

12. The refrigeration cycle apparatus of claim 1, wherein the evaporator is disposed below the condenser, and an inclined portion extending upward from the evaporator toward the condenser is provided in an intermediate portion of the working fluid channel.

13. The refrigeration cycle apparatus of claim 12, wherein an inclination angle θ2 formed by an installation reference plane (F) extending in a horizontal direction and an imaginary straight line (L) connecting the evaporator and the condenser is larger than an allowable inclination angle θ1 of the body casing with respect to the installation reference plane (F).

14. The refrigeration cycle apparatus of claim 12, wherein the refrigerant pipe is disposed below the condenser.

15. The refrigeration cycle apparatus of claim 1, wherein the refrigerant pipe has a plurality of branch portions, and the condenser causes heat exchange between the flammable refrigerant flowing through the branch portions of the refrigerant pipe and the working fluid.

16. The refrigeration cycle apparatus of claim 15, wherein the working fluid channel includes a plurality of working fluid channels, and the plurality of branch portions are provided so as to correspond to the plurality of working fluid channels in a one-to-one manner.

17. The refrigeration cycle apparatus of claim 1, wherein the evaporator is disposed in the fan chamber, and the condenser is disposed in the machine chamber.

\* \* \* \* \*